(12) United States Patent
Kitada et al.

(10) Patent No.: US 8,876,259 B2
(45) Date of Patent: *Nov. 4, 2014

(54) LIQUID EJECTING HEAD, LIQUID EJECTING APPARATUS AND PIEZOELECTRIC ELEMENT

(71) Applicant: Seiko Epson Corporation, Tokyo (JP)

(72) Inventors: Kazuya Kitada, Suwa (JP); Masayuki Omoto, Chino (JP)

(73) Assignee: Seiko Epson Corporation (JP)

( * ) Notice: Subject to any disclaimer, the term of this patent is extended or adjusted under 35 U.S.C. 154(b) by 34 days.

This patent is subject to a terminal disclaimer.

(21) Appl. No.: 13/663,666

(22) Filed: Oct. 30, 2012

(65) Prior Publication Data

US 2013/0106958 A1    May 2, 2013

(30) Foreign Application Priority Data

Nov. 2, 2011  (JP) ................................. 2011-241707

(51) Int. Cl.
| | | |
|---|---|---|
| *B41J 2/045* | (2006.01) | |
| *B41J 2/16* | (2006.01) | |
| *H01L 41/187* | (2006.01) | |
| *H01L 41/09* | (2006.01) | |
| *B41J 2/14* | (2006.01) | |

(52) U.S. Cl.
CPC ................ *B41J 2/1632* (2013.01); *B41J 2/161* (2013.01); *H01L 41/1878* (2013.01); *B41J 2/1629* (2013.01); *H01L 41/1871* (2013.01); *B41J 2202/03* (2013.01); *B41J 2/1646* (2013.01); *B41J 2002/14419* (2013.01); *B41J 2002/14491* (2013.01); *B41J 2/1635* (2013.01); *B41J 2002/14241* (2013.01); *B41J 2/1645* (2013.01); *B41J 2/1642* (2013.01); *B41J 2/1623* (2013.01); *H01L 41/0973* (2013.01); *B41J 2/14233* (2013.01)
USPC ............................................................ 347/68

(58) Field of Classification Search
None
See application file for complete search history.

(56) References Cited

U.S. PATENT DOCUMENTS

2009/0230211 A1*  9/2009  Kobayashi et al. ......... 239/102.2
2013/0106959 A1*  5/2013  Kitada ............................ 347/71

FOREIGN PATENT DOCUMENTS

| JP | 2001-223404 | 8/2001 |
|---|---|---|
| JP | 2009-242229 | 10/2009 |
| JP | 2009-252789 | 10/2009 |

* cited by examiner

*Primary Examiner* — Matthew Luu
*Assistant Examiner* — Erica Lin
(74) *Attorney, Agent, or Firm* — Harness, Dickey & Pierce, P.L.C.

(57) ABSTRACT

Provided is a piezoelectric element including a first electrode, a piezoelectric layer, and a second electrode, wherein the piezoelectric layer is formed of a complex oxide having a perovskite structure containing bismuth, barium, iron and titanium, binding energy of C—C and C—H states of a peak due to C 1s in an X-ray photoelectron spectroscopy measurement is standardized as 284.8 eV, when a peak obtained in a range of a binding energy of 775 eV or more and 785 eV or less is separated using a Gauss function, the binding energy has the peak in 779.0±0.8 eV, and one or more peak having intensity lower than that of the peak is included at the high binding energy side.

5 Claims, 11 Drawing Sheets

LIQUID EJECTING HEAD, LIQUID EJECTING APPARATUS AND PIEZOELECTRIC ELEMENT

The entire disclosure of Japanese Patent Application No. 2011-241707, filed Nov. 2, 2011, is expressly incorporated by reference herein.

BACKGROUND

1. Technical Field

The present invention relates to a liquid ejecting head that includes a piezoelectric element having a piezoelectric layer formed of a piezoelectric material and an electrode and discharges droplets from a nozzle opening, a liquid ejecting apparatus, and a piezoelectric element.

2. Related Art

As a piezoelectric element used in the liquid ejecting head, there has been a piezoelectric element that is configured so that a piezoelectric layer formed of a piezoelectric material exhibiting an electromechanical conversion function, for example, a crystallized dielectric material is interposed between two electrodes. Such a piezoelectric element is mounted on, for example, a liquid ejecting head as a bending vibration mode actuator device. Herein, as a representative example of the liquid ejecting head, for example, there has been an ink jet type recording head in which a part of a pressure generating chamber communicating with a nozzle opening that ejects ink droplets is constituted by a vibration plate, the vibration plate is deformed by the piezoelectric element, and ink in the pressure generating chamber is pressurized and is discharged as ink droplets from the nozzle opening.

The piezoelectric material used as the piezoelectric layer forming such a piezoelectric element requires high piezoelectric characteristics, and lead zirconate titanate (PZT) is adopted as a representative example of the piezoelectric material (see JP-A-2001-223404). However, lead zirconate titanate contains lead, and from the viewpoint of environmental problems, there is a need for a piezoelectric material that does not contain lead. Thus, as a piezoelectric material that does not contain lead, a bismuth-based piezoelectric material, for example, a piezoelectric material having a bismuth ferrate based ($BiFeO_3$-based) perovskite type structure containing bismuth and iron has been suggested. As a specific example, there is a complex oxide expressed by a mixed crystal such as $Bi(Fe,Mn)O_3$ and barium titanate such as $BaTiO_3$ (for example, see JP-2009-252789).

In a non-lead piezoelectric material that does not contain lead, in order to obtain displacement that is equal to or greater than PZT, it is almost always necessary to apply a high voltage. However, if a high voltage is applied, in some cases, dielectric destruction may occur, and thus, higher voltage endurance is demanded.

In addition, of course, such a problem is also similarly present in other liquid ejecting heads that discharge liquid droplets other than ink as well as the ink jet type recording head, and is also similarly present in the piezoelectric element used in other devices than the liquid ejecting head.

SUMMARY

An advantage of some aspects of the invention is to provide a liquid ejecting head that has a small environmental burden and has high voltage endurance, a liquid ejecting apparatus, and a piezoelectric element.

According to an aspect of the invention, there is provided a liquid ejecting head that includes a piezoelectric element having a piezoelectric layer and an electrode provided in the piezoelectric layer, wherein the piezoelectric layer is formed of a complex oxide having a perovskite structure containing bismuth, barium, iron, and titanium, in which a binding energy of C—C and C—H states of a peak due to C 1s in an X-ray photoelectron spectroscopy measurement is standardized as 284.8 eV, and when a peak obtained in a range of a binding energy of 775 eV or more and 785 eV or less is separated using a Gauss function, the binding energy has a peak at 779.0±0.8 eV, and one or more peak having an intensity lower than that of the peak is included at the high binding energy side.

In the aspect, the piezoelectric layer has a predetermined peak in the range of a binding energy of 775 eV or more and 785 eV or less, whereby a piezoelectric element, which has improved voltage endurance and excellent dielectric characteristics, is provided. In addition, since the lead content is suppressed, the load to the environment can be reduced.

Furthermore, it is preferable that the complex oxide contain at least one component selected from a group including manganese, cobalt, chrome, nickel, and copper. Thus, it is possible to obtain a piezoelectric layer in which an occurrence of the leak electric current is further suppressed.

According to another aspect of the invention, there is provided a liquid ejecting apparatus including the liquid ejecting head mentioned above.

In the aspect, since a piezoelectric element which has a reduced load to an environment and high voltage endurance is included, it is possible to realize a reliable liquid ejecting apparatus.

According to still another aspect of the invention, there is provided a piezoelectric element that includes a piezoelectric layer and an electrode provided in the piezoelectric layer, wherein the piezoelectric layer is formed of a complex oxide having a perovskite structure containing bismuth, barium, iron and titanium, binding energy of C—C and C—H states of a peak due to C 1s in an X-ray photoelectron spectroscopy measurement is standardized as 284.8 eV, when a peak obtained in a range of a binding energy of 775 eV or more and 785 eV or less is separated using a Gauss function, the binding energy has the peak in 779.0±0.8 eV, and one or more peak having intensity lower than that of the peak is included at the high binding energy side.

In the aspect, the piezoelectric layer has a predetermined peak in the range of a binding energy of 775 eV or more and 785 eV or less, whereby a piezoelectric element, which has improved voltage endurance and excellent dielectric characteristics, is provided. In addition, since the lead content is suppressed, a load to the environment can be reduced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
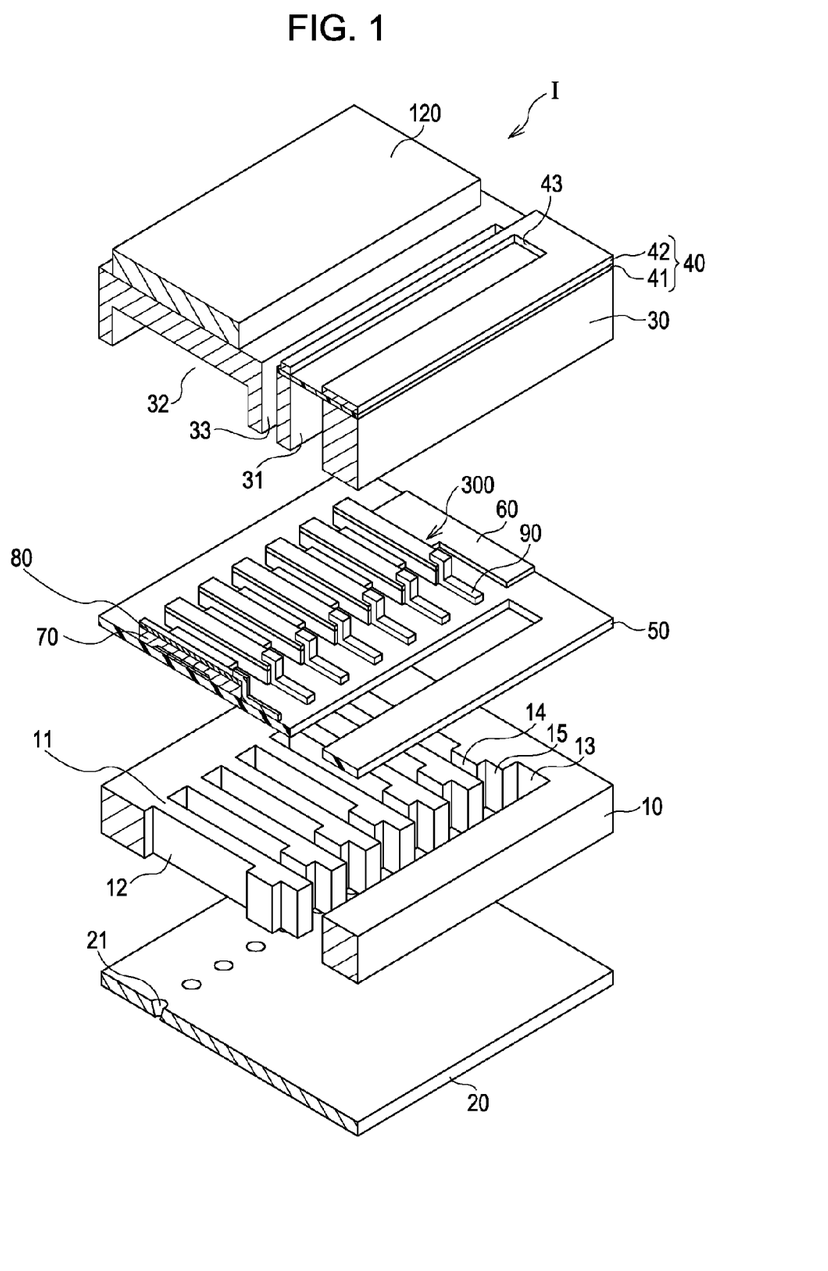
FIG. 1 is an exploded perspective view that shows a schematic configuration of a recording head according to Embodiment 1.
Figure 2A:
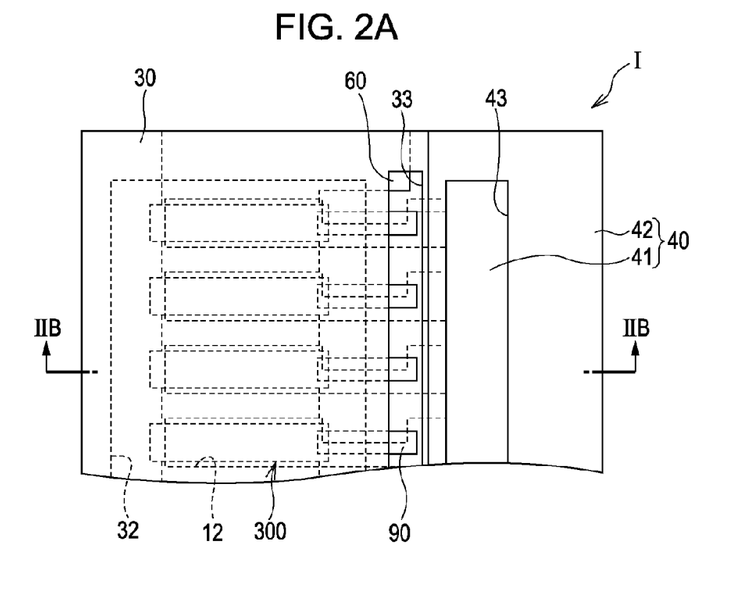
FIGS. 2A and 2B are a plan view and a cross-sectional view of the recording head according to Embodiment 1.
Figure 2B:
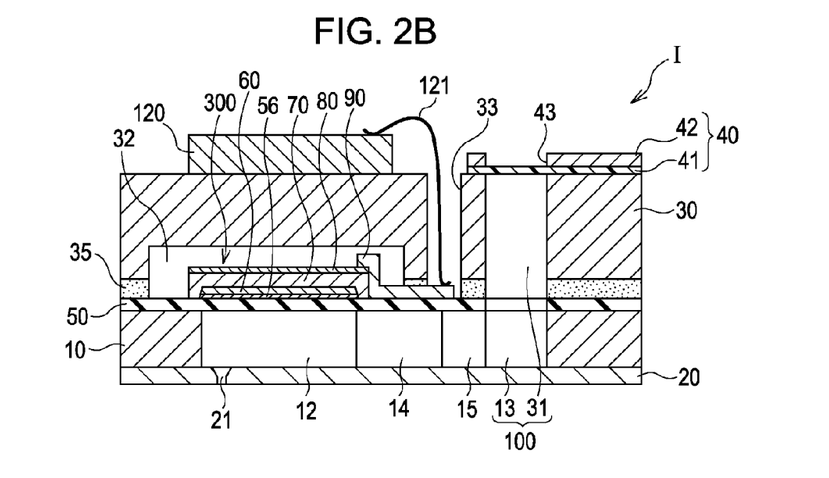

FIG. 1 is a perspective view of an ink jet type recording head that is an example of a liquid ejecting head according to Embodiment 1 of the invention, and FIGS. 2A and 2B are a plan view of FIG. 1 and a cross-sectional view of a line IIB-IIB.

As shown, a flow path forming substrate 10 is made of a silicon single crystalline substrate of an orientation (110) in the present embodiment, and on one surface thereof, an elastic film 50 of a thickness of 0.5 to 2 μm formed of silicon dioxide forming a vibration plate is formed.

The flow path forming substrate 10 is formed with a pressure generating chamber 12 by performing the anisotropic etching from the other surface side opposite to one surface. Moreover, the pressure generating chamber 12 partitioned by a plurality of partitions 11 is arranged along a direction in which a plurality of nozzle openings 21 discharging the same color ink are arranged. Hereinafter, the direction is referred to as an arrangement direction of the pressure generating chamber 12 or a first direction, and a direction perpendicular to the direction is referred to as a second direction. Furthermore, at one end portion side of the pressure generating chamber 12 of the flow path forming substrate 10 in the second direction, an ink supply path 14 and a communication path 15 are partitioned by the partition 11. Furthermore, in one end of the communication path 15, a communication portion 13, which forms a part of a manifold 100 serving as a common ink chamber (a liquid chamber) of the respective pressure generating chambers 12, is formed. That is, the flow path forming substrate 10 is provided with a liquid flow path that includes a pressure generating chamber 12, the ink supply path 14, the communication path 15, and the communication portion 13.

The ink supply path 14 communicates with one end portion side of the pressure generating chamber 12 in the second direction, and has a cross-sectional area that is smaller than that of the pressure generating chamber 12. For example, in the present embodiment, the ink supply path 14 is formed to have a width smaller than that of the pressure generating chamber 12 by squeezing the flow path of the pressure generating chamber 12 side between the manifold 100 and each pressure generating chamber 12 in a width direction. In addition, in this manner, in the present embodiment, although the ink supply path 14 is formed by squeezing the width of the flow path from the one side, the ink supply path may be formed by squeezing the width of the flow path from both sides. Furthermore, the ink supply path may be formed by squeezing the flow path without squeezing the width of the flow path. In addition, each communication path 15 communicates with the ink supply path 14 of the side opposite to the pressure generating chamber 12, and has a cross-sectional area that is greater than the width direction (the first direction) of the ink supply path 14. In the present embodiment, the communication path 15 is formed to have the same cross-sectional area as that of the pressure generating chamber 12 in the width direction (the first direction).

Furthermore, at the opening surface side of the flow path forming substrate 10, a nozzle plate 20 drilled with a nozzle opening 21 communicating with the vicinity of the end portion of each pressure generating chamber 12 of the side opposite to the ink supply path 14 is fixed using an adhesive, a thermal welding film or the like. In addition, the nozzle plate 20 is formed of, for example, a glass ceramic, a silicon single crystalline substrate, a stainless steel or the like.

Meanwhile, as shown in FIG. 2B, at the side opposite to the opening surface of the flow path forming substrate 10, as mentioned above, the elastic film 50 is formed as mentioned above, and an adhesion layer 56, which is formed of, for example, titanium oxide of a thickness of about 30 to 50 nm to improve adhesion of the elastic film 50 or the like to the foundation of the first electrode 60, is formed on the elastic film 50. In the present embodiment, although titanium oxide is used as the adhesion layer 56, the material of the adhesion layer 56 differs depending on the first electrode 60 and the kind of the foundation thereof, but, for example, zirconium, oxide containing aluminum, nitride, $SiO_2$, MgO, $CeO_2$ or the like can be used. In addition, an insulator film formed of zirconium oxide or the like may be provided on the elastic film 50 if necessary.

Furthermore, the first electrode 60, a piezoelectric layer 70 which is a thin film provided over the first electrode 60 and having a thickness of 3 μm or less, preferably 0.3 to 1.5 μm, and a second electrode 80 provided over the piezoelectric layer 70, are laminated and formed on the adhesion layer 56, and constitute a piezoelectric element 300 as pressure generating means that causes the pressure change in the pressure generating chamber 12. In addition, the above mentioned herein also includes right above, and a state where another member is interposed therebetween. Herein, the piezoelectric element 300 refers to a portion that includes the first electrode 60, the piezoelectric layer 70, and the second electrode 80. Generally, one electrode of the piezoelectric element 300 is used as a common electrode, and the other electrode thereof and the piezoelectric layer 70 are patterned and configured for each pressure generating chamber 12. In the present embodiment, although the first electrode 60 is the common electrode of the piezoelectric element 300 and the second electrode 80 is an individual electrode of the piezoelectric element 300, they may be reversed on account of the drive circuit and the wiring. Furthermore, herein, the piezoelectric element 300 provided in a displaceable manner is referred to as an actuator device. In addition, in the embodiment mentioned above, the elastic film 50, the adhesion layer 56 and the first electrode 60 act as the vibration film, however, of course, without being limited thereto, for example, only the first electrode 60 may act as the vibration plate, without providing the elastic film 50 and the adhesion layer 56. Furthermore, the piezoelectric element 300 oneself may also substantially function as the vibration plate.

Moreover, the piezoelectric layer 70 is formed of the composite oxide having the perovskite structure containing bismuth (Bi), barium (Ba), iron (Fe) and titanium (Ti), the binding energy of the C—C and C—H state of the peak due to C 1s in the X-ray photoelectron spectroscopy measurement is standardized as 284.8 eV, when the peak obtained in the range of a binding energy of 775 eV or more and 785 eV or less is separated using the Gauss function, the binding energy has the peak in 779.0±0.8 eV, and one or more peak having intensity lower than that of the peak is included at the high binding energy side.

As mentioned above, the piezoelectric layer 70 has a layer in which the binding energy of the C—C and C—H state of the peak due to C 1s in the X-ray photoelectron spectroscopy measurement is standardized as 284.8 eV, when the peak obtained in the range of a binding energy of 775 eV or more and 785 eV or less is separated using the Gauss function, the binding energy has the peak in 779.0±0.8 eV, and one or more peak having intensity lower than that of the peak is included at the high binding energy side. The piezoelectric layer 70 formed of the complex oxide of a molecular state exhibiting such a peak in the X-ray photoelectron spectroscopy can have improved voltage endurance and high insulation properties. In other words, the invention realizes excellent voltage endurance and high insulation properties using the piezoelectric layer 70 in which when the peak obtained in the range of a binding energy of 775 eV or more and 785 eV or less is separated using the Gauss function in the X-ray photoelectron spectroscopy measurement, the binding energy has the peak in a predetermined range, and one or more peak having intensity lower than that of the peak is included at the high binding energy side.

The piezoelectric layer 70 has no peak of intensity that is higher than that of the peak of the range of 779.0±0.8 eV in all of the low binding energy side and the high binding energy side than 779.0±0.8 eV, when separating the peak. That is, when separating the peak mentioned above, the piezoelectric layer 70 has the peak in 779.0±0.8 eV, and has one or more peak located the high binding energy side than the above-mentioned peak, and intensity of the peak of 779.0±0.8 eV is highest. In addition, when separating the peak mentioned above, in a case where the high binding energy side and the low binding energy side than the above-mentioned peak of 779.0±0.8 eV have the peak of intensity that is higher than that of the peak of 779.0±0.8 eV, voltage endurance is lowered.

Herein, the peak obtained in the range of a binding energy of 775 eV or more and 785 eV is a peak due to Ba 3d5, that is, a peak due to 3 d5 of barium (Ba) trajectory. Furthermore, in the invention, the expression "having the peak in 779.0±0.8 eV" refers to having a peak in which the position of maximum intensity is in 779.0±0.8 eV. The peak obtained in a binding energy of 775 eV or more and 785 eV or less can be adjusted depending on, for example, a change in composition ratio of an element constituting the complex oxide, and adjustment of a firing time and a firing temperature when forming the piezoelectric layer 70, a change in firing atmosphere or the like. Accordingly, the piezoelectric element 300 including the piezoelectric layer 70 may be mass-produced after checking whether or not, in the piezoelectric layer 70 manufactured under predetermined conditions, the peak obtained in the range of a binding energy of 775 eV or more and 785 eV or less satisfies the condition mentioned above, using the pre-measurement.

Furthermore, the X-ray photoelectron spectroscopy may be measured by a commercially available X-ray photoelectron spectroscopic instrument, and for example, can be measured using a Kα ray of Al as an excited X-ray. In the present embodiment, the measurement is performed using a monochrome Al-Kα (1486.6 eV) as the excited X-ray by the X-ray photoelectron spectroscopic instrument (XPS; made from Thermo Fisher Scientific company, ESCALAB 250).

Furthermore, the complex oxide has the perovskite type structure as mentioned above, that is, $ABO_3$ type structure, oxygen 12 coordinates in an A site of the structure, and oxygen 6 coordinates in a B site thereof to form an octahedron. Moreover, bismuth and barium are included in the A site of the perovskite structure and iron and titanium are included in the B site.

The complex oxide having the perovskite structure containing Bi, Fe, Ba and Ti is expressed as, for example, the complex oxide having the perovskite structure of the mixed crystal of—bismuth ferrate—and barium titanate, or a solid solution in which—bismuth ferrate—and barium titanate are uniformly mixed with each other. In addition, in the X-ray diffraction pattern, bismuth ferrate and barium titanate are not detected alone.

Herein, bismuth ferrate and barium titanate are each known piezoelectric materials having the perovskite structure, and various compositions are known. For example, as bismuth ferrate and barium titanate, in addition to $BiFeO_3$ and $BaTiO_3$, a material is also known in which a part of the element is lost or excess, or a part of the element is replaced with another element. However, when the term "bismuth ferrate—and barium titanate" is used in the invention, unless the basic characteristics are changed, a material which deviates from a stoichiometric composition due to loss and surplus and in which a part of the element is replaced with another element is also included in the range of—bismuth ferrate—and barium titanate.

The composition of the piezoelectric layer 70 formed of the complex oxide having such a perovskite structure is expressed, for example, as the mixed crystal as expressed in general formula (1) as mentioned below. Furthermore, the formula (1) can also be expressed by general formula (1') as mentioned below. Herein, the descriptions of the general formula (1) and the general formula (1') are composition writings based on stoichiometry, and as mentioned above, as far as the perovskite structure can be taken, a partial exchange of the element or the like is also allowed as well as an inevitable change of the composition due to the lattice mismatch and oxygen deficiency or the like. For example, if a stoichiometric ratio is 1, the value within a range of 0.85 to 1.20 is allowed.

$(1-x)[BiFeO_3]-x[BaTiO_3]$      (1)

$(0 < x \leq 0.40)$ $(Bi_{1-x}Ba_x)(Fe_{1-x}Ti_x)$      (1')

$(0 < x \leq 0.40)$

Furthermore, the complex oxide forming the piezoelectric layer 70 may contain elements other than Bi, Fe, Ba and Ti. As other elements, transition metal elements such as Mn, Co, Cr, Ni and Cu are adopted, and two or more kinds thereof may be contained, but it is particularly preferable to contain Mn or Co. Of course, a complex oxide containing other elements also needs to have the perovskite structure.

In a case where the piezoelectric layer 70 contains, for example, Mn, the complex oxide constituting the piezoelectric layer 70 is expressed as the complex oxide that has a structure in which a part of the solid solution, in which—bismuth ferrate—and barium titanate are uniformly dissolved, is replaced with Mn, or the perovskite structure of the mixed crystal of—bismuth ferrate—and barium titanate, and the basic characteristics are the same as the complex oxide having the perovskite structure of the mixed crystal of—bismuth ferrate—and barium titanate, but the leak characteristics are improved. In addition, in the X-ray diffraction pattern, bismuth ferrate, barium titanate, and are not detected alone.

Furthermore, even in a case of containing other transition metals mentioned above, a structure is expressed in which a part of Fe is replaced with the transition metals, and thus, the leak characteristics are improved.

In addition to Bi, Fe, Ba and Ti, the piezoelectric layer 70 formed of the complex oxide having the perovskite structure containing the transition metal elements such as Mn is, for example, a mixed crystal expressed by general formula (2) as mentioned below. Furthermore, the formula (2) can also be expressed by general formula (2') as mentioned below. Furthermore, in the general formula (2) and the general formula (2'), M is the transition metal element such as Mn, Co, Cr, Ni and Cu. Herein, the descriptions of the general formula (2) and the general formula (2') composition notations based on stoichiometry, and as mentioned above, as far as the perovskite structure can be taken, an inevitable change of the composition due to the lattice inconsistency and oxygen deficiency or the like is allowed. For example, if a stoichiometric ratio is 1, the value within the range of 0.85 to 1.20 is allowed.

$$(1-x)[Bi(Fe_{1-y}M_y)O_3]-x[BaTiO_3] \quad (2)$$

$$(0<x \leq 0.40, 0.01 \leq y \leq 0.10)$$

$$(Bi_{1-x}Ba_x)((Fe_{1-y}M_y)1-xTi_x) \quad (2')$$

$$(0<x \leq 0.40, 0.01 \leq y \leq 0.10)$$

In the present embodiment, the piezoelectric layer 70 is formed of bismuth ferrate manganite titanate barium ((Bi, Ba)(Fe, Mn, Ti)O$_3$), in other words, the complex oxide having the perovskite type structure expressed as the mixed crystal of bismuth ferrate manganate—and barium titanate. The complex oxide having the perovskite structure containing bismuth, barium, iron, manganese and titanium preferably has, for example, the composition ratio expressed in general formula (3) as mentioned below. However, the description of the general formula (3) is the composition writing based on stoichiometry, and an inevitable composition difference due to the element diffusion, the lattice mismatch, the oxygen deficiency or the like is allowed.

$$[(1-x)\{Bi(Fe_{1-a}Mn_a)O_3\}-x\{BaTiO_3\}] \quad (3)$$

$$(0.10<x \leq 0.40, 0.01 \leq a \leq 0.10)$$

A lead electrode 90, for example, formed of gold (Au) or the like, which is drawn from the vicinity of the end portion of the ink supply path 14 side and is extended and provided onto the elastic film 50 and an insulator film provided if necessary, is connected to the respective second electrodes 80 that are the individual electrodes of the piezoelectric element 300.

A protective substrate 30 having a manifold portion 31 forming at least a part of the manifold 100 is bonded via the adhesive 35 onto the flow path forming substrate 10 on which the piezoelectric element 300 is formed, that is, the first electrode 60, the elastic film 50, the insulator film provided if necessary, and the lead electrode 90. In the present embodiment, the manifold portion 31 penetrates the protective substrate 30 in the thickness direction, is formed throughout the pressure generating chamber 12 in the width direction, communicates with the communication portion 13 of the flow path forming substrate 10 as mentioned above, and constitutes the manifold 100 serving as the common ink chamber of the respective pressure generating chambers 12. In the example mentioned above, although the manifold portion 31 and the communication portion 13 serve as the manifold 100, the communication portion 13 of the flow path forming substrate 10 may be divided into a plurality of portions for each pressure generating chamber 12, and only the manifold portion 31 may be used as the manifold, naturally without being limited thereto. Furthermore, for example, only the pressure generating chamber 12 may be provided in the flow path forming substrate 10, and the ink supply path 14, through which the manifold 100 communicates with the respective pressure generating chambers 12, may be provided in a member (for example, the elastic film 50, the insulator film provided if necessary or the like) interposed between the flow path forming substrate 10 and the protective substrate 30.

Furthermore, in a region of the protective substrate 30 facing the piezoelectric element 300, a piezoelectric element holding portion 32 having a space of the degree that does not disturb the movement of the piezoelectric element 300 is provided. The piezoelectric element holding portion 32 may have the space of the degree that does not disturb the movement of the piezoelectric element 300, and the space may be sealed or may not be sealed.

It is desirable to use a material having substantially the same coefficient of thermal expansion as that of the flow path forming substrate 10, for example, glass, ceramic or the like as such a protective substrate 30. In the present embodiment, the protective substrate 30 is formed using the silicon single crystalline substrate of the same material as the flow path forming substrate 10.

Furthermore, the protective substrate 30 is formed with a through hole 33 that penetrates the protective substrate 30 in the thickness direction. Moreover, the vicinity of the end portion of the lead electrode 90 drawn from each piezoelectric element 300 is provided so as to be exposed into the through hole 33.

Furthermore, a drive circuit 120 for driving the arranged piezoelectric element 300 is fixed onto the protective substrate 30. As the drive circuit 120, for example, the circuit board, the semiconductor integrated circuit (IC) or the like can be used. Moreover, the drive circuit 120 and the lead electrode 90 are electrically connected to each other via a connection wiring 121 formed of a conductive wire such as a bonding wire.

Furthermore, a compliance substrate 40 constituted by a sealing film 41 and a fixing plate 42 is bonded onto the protective substrate 30. Herein, the sealing film 41 is formed of a flexible material having low rigidity, and one surface of the manifold portion 31 is sealed by the sealing film 41. Furthermore, the fixing plate 42 is formed of a relatively hard material. Since a region of the fixing plate 42 facing the manifold 100 is an opening portion 43 that is completely removed in the thickness direction, the one surface of the manifold 100 is sealed only by the sealing film 41 having flexibility.

In ink jet type recording head I of the present embodiment, ink is taken from an ink introduction port connected to external ink supplying means (not shown), after the inside from the manifold 100 to the nozzle opening 21 is filled with ink, the voltage is applied between the respective first electrodes 60 and second electrodes 80 corresponding to the pressure generating chamber 12 depending on the recording signal from the drive circuit 120, and the elastic film 50, the first electrode 60 and the piezoelectric layer 70 are bent and deformed, whereby the pressure in each pressure generating chambers 12 increases, and the ink droplet is discharged from the nozzle opening 21.

Next, an example of a manufacturing method of the ink jet type recording head of the present embodiment will be described with reference to FIG. 3A to FIG. 7B. In addition FIGS. 3A to 7B are cross-sectional views of the pressure generating chamber in the longitudinal direction (a second direction).

Figure 3A:
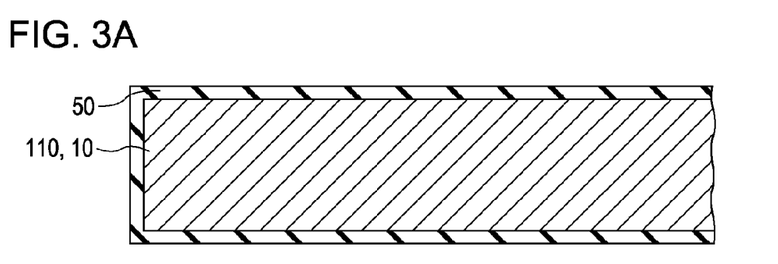
FIGS. 3A and 3B are cross-sectional views that show a manufacturing process of the recording head according to Embodiment 1.
Figure 3B:
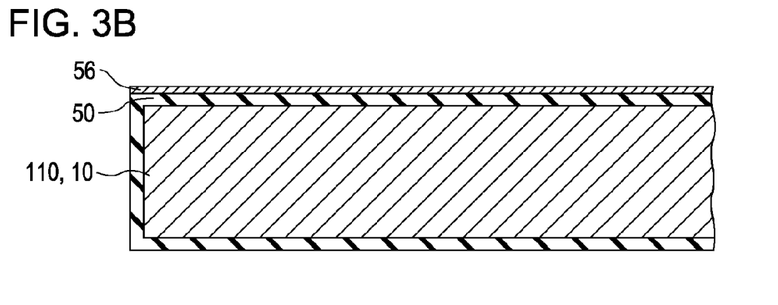

Firstly, as shown in FIG. 3A, a silicon dioxide film formed of silicon dioxide ($SiO_2$) or the like forming the elastic film 50 is formed by thermal oxidation or the like on the surface of the flow path forming substrate wafer 110 which is a silicon wafer. Next, as shown in FIG. 3B, the adhesion layer 56 formed of titanium oxide or the like is formed on the elastic film 50 (the silicon dioxide film) using the sputtering method, the thermal oxidation method or the like.

Figure 4A:
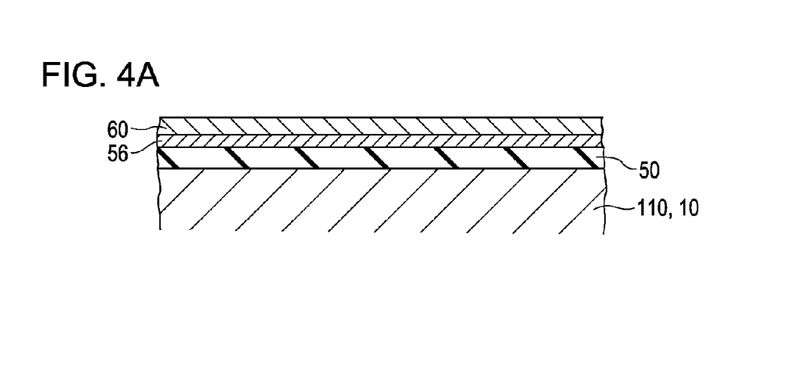
FIGS. 4A to 4C are cross-sectional views that show a manufacturing process of the recording head according to Embodiment 1.
Figure 4B:
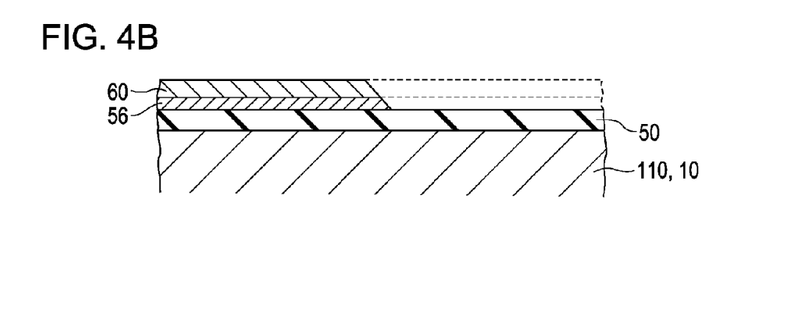

Next, as shown in FIG. 4A, the first electrode 60 is formed along the entire surface of the adhesion layer 56. Specifically, the first electrode 60 formed of platinum, iridium, iridium oxide or laminated structure thereof is formed over the whole surface on the adhesion layer 56 using the sputtering method, the vapor deposition method or the like. Next, as shown in FIG. 4B, a resist of a predetermined shape (not shown) is masked on the first electrode 60, and the adhesion layer 56 and the side surface of the first electrode 60 are concurrently patterned so as to be tilted.

Next, after peeling off the resist, the piezoelectric layer 70 is laminated on the first electrode 60 (and the adhesion layer 56). At this time, the piezoelectric layer 70 is formed of a material in which the binding energy of C—C and C—H states of a peak due to C 1s in an X-ray photoelectron spectroscopy measurement is standardized as 284.8 eV, when a peak obtained in a range of a binding energy of 775 eV or more and 785 eV or less is separated using a Gauss function, the binding energy has the peak in 779.0±0.8 eV, and one or more peak having intensity lower than that of the peak is included at the high binding energy side. Herein, a method of causing the piezoelectric layer 70 to set the peak obtained in the range of binding energy of 775 eV or more and 785 eV or less in the X-ray photoelectron spectroscopy measurement to the value mentioned above will be described. The peak in the X-ray photoelectron spectroscopy measurement can be adjusted depending on a change of the composition ratio of the element constituting the complex oxide, an adjustment of the firing time and the firing temperature when forming the piezoelectric layer 70, a change of the firing atmosphere or the like. That is, by suitably changing such conditions, in the X-ray photoelectron spectroscopy measurement, the peak obtained in the range of binding energy of 775 eV or more and 785 eV or less may satisfy the above-mentioned conditions.

Although the method of manufacturing the piezoelectric layer 70 is not particularly limited, the piezoelectric layer 70 can be manufactured using a MOD (Metal-Organic Decomposition) method of coating and drying the solution in which a metal complex containing Bi, Fe, Mn, Ba and Ti is dissolved and dispersed in the solvent, and firing and crystallizing the solution at a high temperature to obtain a piezoelectric layer (a piezoelectric film) formed of a metal oxide, and a chemical solution method such as a sol-gel method. In addition, it is also possible to manufacture the piezoelectric layer 70 using a liquid-phase method, a solid-phase method and a gas-phase method such as a sputtering method, a pulse-laser-deposition method (PLD) method, a CVD method, an aerosol-deposition method.

Figure 4C:
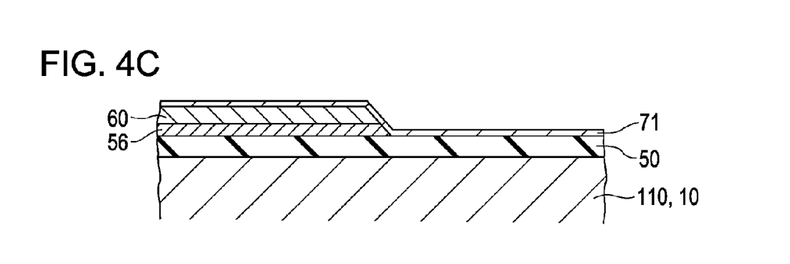

In addition, in the present embodiment, the piezoelectric layer 70 was manufactured using the chemical solution method such as the MOD method and the sol-gel method. Specifically, as shown in FIG. 4C, the sol and the MOD solution (a precursor solution) which contain the metal complex, specifically, the metal complex containing Bi, Fe, Mn, Ba and Ti is coated on the first electrode 60 at a predetermined rate using the spin coat method to form a precursor film 71 (a coating process).

As in the present embodiment, in a case of forming the piezoelectric layer 70 formed of the complex oxide of the perovskite structure containing bismuth iron, manganese, barium and titanium, the precursor solution to be coated is a solution in which the metal complex mixture capable of forming the complex oxide containing bismuth iron, manganese, barium and titanium using the firing is dissolved or dispersed in an organic solvent. The metal complex mixture is a mixture of the metal complex that contains one or more metals of the metals constituting the complex oxide, and the metal complex is mixed so that each metal of Bi, Fe, Mn, Ba and Ti has a desired mol ratio. That is, in the present embodiment, the mixing rate of the metal complex each containing Bi, Fe, Mn, Ba and Ti is a rate in which each metal of Bi, Fe, Mn, Ba and Ti becomes the complex oxide expressed as the mixed crystal of desired bismuth ferrate manganate and barium titanate. Although the piezoelectric layer 70 of the present embodiment has the perovskite type structure that is expressed as the mixed crystal of bismuth ferrate manganite and barium titanate, by changing the rate of barium titanate, it is possible to change the peak obtained in the range of binding energy of 775 eV or more and 785 eV or less. In addition, the presence or absence of manganese and the rate of manganese in the complex oxide hardly affects the peak obtained in the range of binding energy of 775 eV or more and 785 eV or less.

As the metal complex each containing Bi, Fe, Mn, Ba and Ti, for example, alkoxide, organic acid salt, β diketone complex or the like can be used. As the metal complex containing Bi, for example, bismuuth 2-ethylhexeanoate, bismuth acetate or the like can be used. As the metal complex containing Fe, for example iron 2-ethylhexanoate, iron acetate or the like can be used. As the metal complex containing Mn, for example, manganese 2-ethylhexanoate, manganese acetate or the like can be used. As the metal complex containing Ba, for example, barium isopropoxide, barium 2-ethylhexeanoate, barium acetylacetonate or the like can be used. As the metal complex containing Ti, for example, titanium isopropoxide, titanium 2-ethylhexanoate, titanium isopropoxide, titanium (di-1-propoxide) bis (acetylacetonato) or the like can be used. Of course, a metal complex containing two kinds or more of Ti, Fe, Mn, Ba and Ti may be used.

Furthermore, the solvent may dissolve or disperse the metal complex mixture, and although it is not particularly limited, various solvents can be used such as toluene, xylene, octane, ethylene glycol, 2-methoxyethanol, butanol, ethanol, isopropyl alcohol, acetic acid, water or the like. Of course, two or more kinds thereof may be used.

Next, the piezoelectric precursor film 71 is heated at a predetermined temperature (for example, 130 to 200° C.) and is dried for a fixed time (a drying process). Next, the dried piezoelectric precursor film 71 is heated at a predetermined temperature (for example, 350 to 450° C.) and is kept for a fixed time to remove grease (a degreasing process). The degreasing mentioned herein disengages the organic components contained in the piezoelectric precursor film 71, for example, as $NO_2$, $CO_2$, $H_2O$ or the like. The atmospheres of the drying process and the degreasing process are not limited but may be air, an oxygen atmosphere, and an inactive gas. In addition, the coating process, the drying process and the degreasing process may be performed for several times.

Figure 5A:
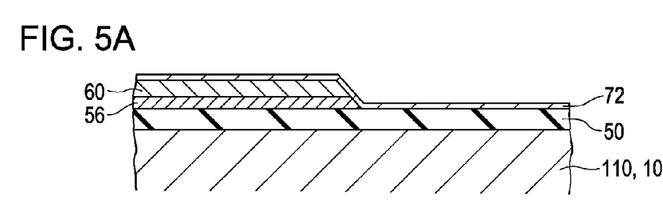
FIGS. 5A and 5B are cross-sectional views that show a manufacturing process of the recording head according to Embodiment 1.

Next, as shown in FIG. 5A, by heating the piezoelectric precursor film 71 at a predetermined temperature, for example, about 600 to 850° C., and keeping the piezoelectric precursor film 71 for a fixed time, for example, for 1 to 10 minutes, the piezoelectric precursor film 71 is crystallized, thereby forming the piezoelectric film 72 formed of a complex oxide that is expressed as the mixed crystal of bismuth ferrate manganate and barium titanate (a firing process). The atmosphere of the firing process may be performed in air, an oxygen atmosphere, and an inactive atmosphere without being limited. Herein, it is possible to change the peak obtained in the range of binding energy of 775 eV or more and 785 eV or less by changing the firing temperature. Furthermore, it is possible to change the peak obtained in the range of binding energy of 775 eV or more and 785 eV or less by changing the firing time.

As a heating device used in the drying process, the degreasing process and the firing process, for example, an RTA (Rapid Thermal Annealing) device performing the heating by the irradiation of an infrared lamp, a hot plate or the like are adopted.

Figure 5B:
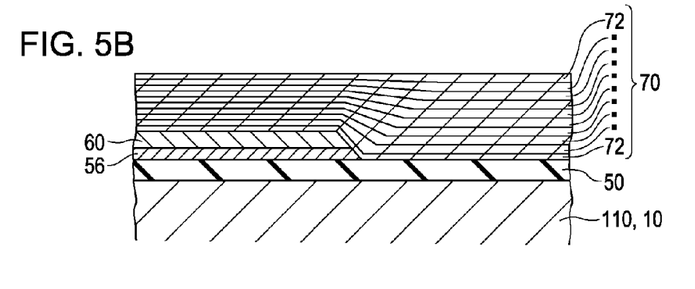

Next, by repeating the coating process, the drying process and the degreasing process mentioned above or a series of the coating process, the drying process, the degreasing process and the firing process several times depending on a desired film thickness to form the plurality of piezoelectric films 72. As a result, the piezoelectric layer 70 with a predetermined thickness constituted by the plurality of piezoelectric films 72 as shown in FIG. 5B is formed. In addition, when forming the plurality of piezoelectric films 72, although the films may be laminated by sequentially performing the coating process, the drying process, the degreasing process and the firing process, after repeatedly performing the coating process, the drying process and the degreasing process, the plurality of layers may be collectively fired. Furthermore, in the present embodiment, although the piezoelectric film 72 was provided by being laminated, only one layer may be adopted.

Figure 6A:
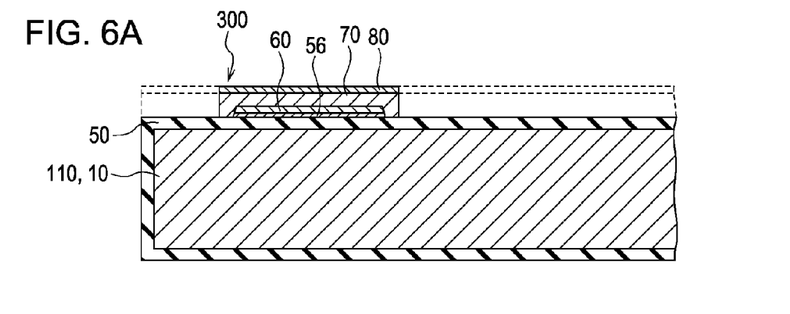
FIGS. 6A to 6C are cross-sectional views that show a manufacturing process of the recording head according to Embodiment 1.

After forming the piezoelectric layer 70 in this manner, as shown in FIG. 6A, a second electrode 80 formed of platinum or the like is formed on the piezoelectric layer 70 by the sputtering method or the like, the piezoelectric layer 70 and the second electrode 80 are concurrently patterned in a region opposite to the respective pressure generating chambers 12, and a piezoelectric element 300 is formed that is constituted by the first electrode 60, the piezoelectric layer 70 and the second electrode 80. In addition, the patterning of the piezoelectric layer 70 and the second electrode 80 can be performed in a lump by performing the dry etching via a resist (not shown) formed in a predetermined shape. After that, if necessary, for example, post-annealing may be formed at a temperature range of 600 to 800° C. As a result, it is possible to satisfactorily form an interface between the piezoelectric layer 70 and the first electrode 60 or the second electrode 80, and thus, crystal characteristics of the piezoelectric layer 70 can be improved.

Figure 6B:
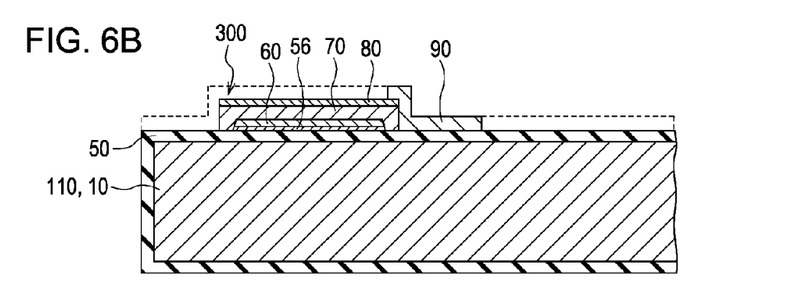

Next, as shown in FIG. 6B, after forming the lead electrode 90 formed of, for example, gold (Au) or the like throughout the entire surface of the flow path forming substrate wafer 110, for example, each piezoelectric element 300 is patterned via a mask pattern (not shown) formed of a resist or the like.

Figure 6C:
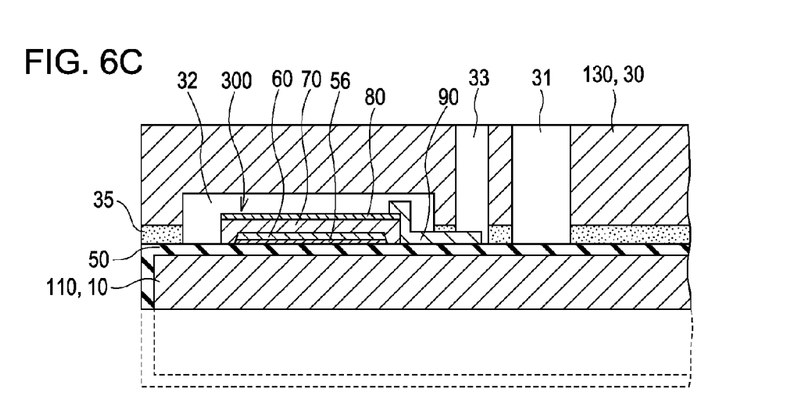

Next, as shown in FIG. 6C, a protective substrate wafer 130, which is a silicon wafer and serves as a plurality of protective substrates 30, is bonded to the piezoelectric element 300 side of the flow path forming substrate wafer 110 via the adhesive 35, and then, the flow path forming substrate wafer 110 is thinned to a predetermined thickness.

Figure 7A:
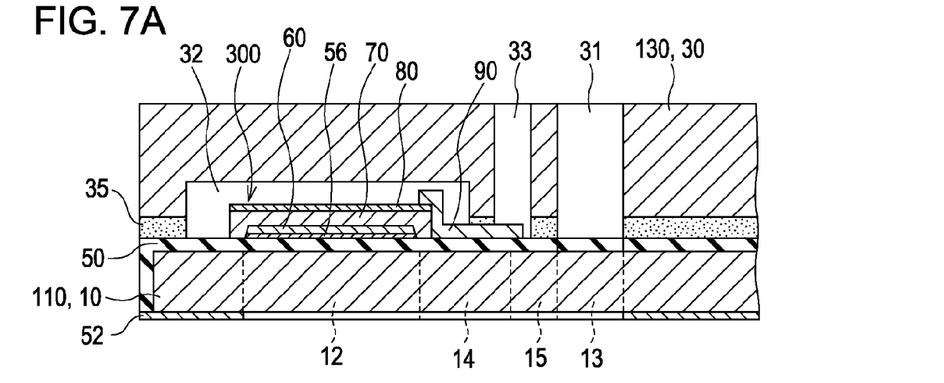
FIGS. 7A and 7B are cross-sectional views that show a manufacturing process of the recording head according to Embodiment 1.

Next, as shown in FIG. 7A, a mask film 52 is newly formed on the flow path forming substrate wafer 110 and is patterned to a predetermined shape.

Figure 7B:
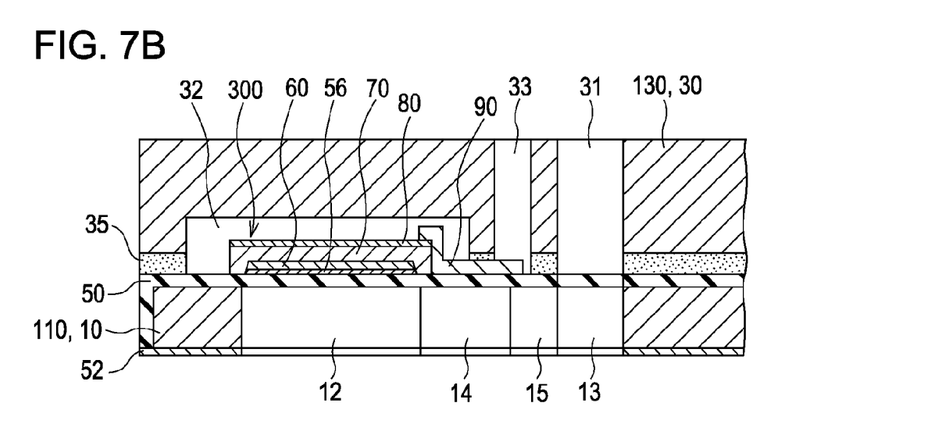

Moreover, as shown in FIG. 7B, by performing the anisotropic etching (wet etching) of the flow path forming substrate wafer 110 using an alkali solution such as a KOH via the mask film 52, the pressure generating chamber 12, the communication portion 13, the ink supply path 14, the communication path 15 or the like corresponding to the piezoelectric element 300 are formed.

Next, unnecessary portions of the outer peripheral portions of the flow path forming substrate wafer 110 and the protective substrate wafer 130 are removed, for example, by being cut using dicing or the like. Moreover, after removing the mask film 52 of the surface of the side of the flow path forming substrate wafer 110 opposite to the protective substrate wafer 130, the nozzle plate 20 drilled with the nozzle opening 21 is joined, the compliance substrate 40 is joined to the protective substrate wafer 130, and the ink jet type recording head I of the present embodiment is formed by dividing flow path forming substrate wafer 110 or the like into the chip-sized flow path forming substrate 10 as shown in FIG. 1.

Herein, the embodiment is shown and the invention will be more specifically described. In addition, the invention is not limited to the embodiment mentioned below.

Example 1

Firstly, the silicon dioxide film with a thickness of 1170 nm was formed on the surface of the single crystal silicon oriented to (110) by the thermal oxidation. Next, titanium oxide with a thickness of 40 nm was formed on the silicon dioxide film by a RF magnetron sputtering method, and the titanium oxide film was formed by the thermal oxidation. Next, a platinum film with a thickness of 100 nm was formed on the titanium oxide film by the RF magnetron sputtering method to form the first electrode 60 oriented to (111).

Furthermore, the n-octane solutions of bismuth 2-ethylhexanoate, iron 2-ethylhexanoate, bismuuth 2-ethylhexeanoate, titanium 2-ethylhexeanoate and manganese 2-ethylhexanoate were mixed so that the mol ratios of Bi:Ba:Fe:Ti: Mn were 75:25:71.25:25:3.75 to adjust the precursor solution.

Next, the precursor solution dropped on the substrate formed with the titanium oxide and the first electrode 60, the substrate was rotated at 500 rpm for 5 seconds, then the substrate was rotated at 3000 rpm for 20 seconds and the piezoelectric precursor film was formed using the spin coat method (a coating process). Next, the substrate was placed on the hot plate and was dried at 180° C. for 2 minutes (a drying process). Next, the substrate was placed on the hot plate and the degreasing was performed at 350° C. for 2 minutes (a degreasing process). After repeating the processes including the coating process, the drying process and the degreasing process three times, the firing was performed in an oxygen atmosphere at 650° C. for 5 minutes by a RTA device (a firing process).

Next, the processes were repeated four times, and the piezoelectric layer 70 with a thickness of 900 nm was manufactured by the total of twelve coatings.

After that, after forming the platinum film with a film thickness of 100 nm on the piezoelectric layer 70 as the second electrode 80 by the DC sputtering method, by performing the firing at 650° C. for 5 minutes under the $O_2$ flow using the RTA, the piezoelectric element was formed.

Example 2

A piezoelectric element of Example 2 was formed in the same manner as Example 1 except that the firing temperature was 700° C.

Example 3

A piezoelectric element of Example 3 was formed in the same manner as Example 2 except that the precursor solution sets the mol ratio of Bi:Ba:Fe:Ti:Mn to 75:25:72.75:25:2.25.

Example 4

A piezoelectric element of Example 4 was formed in the same manner as Example 2 except that—manganese 2-ethylhexanoate was not added, and the precursor solution sets the mol ratio of Bi:Ba:Fe:Ti to 75:25:75:25.

Comparative Example 1

A piezoelectric element of Comparative Example 1 was formed in the same manner as Example 1 except that the firing temperature was 800° C.

Test Example 1

Figure 8:
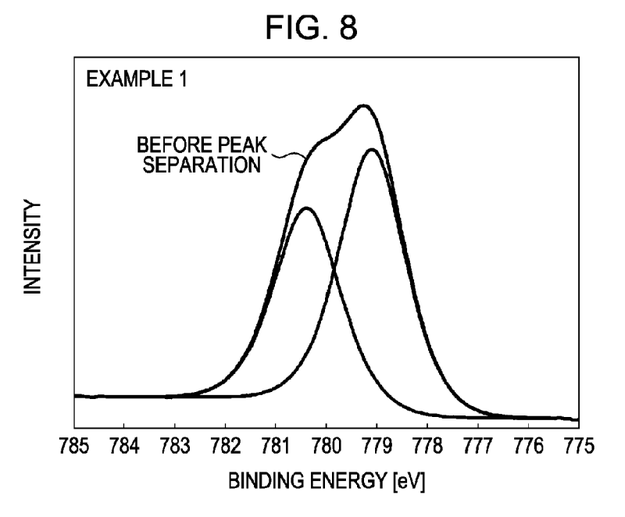
FIG. 8 is a diagram that shows a peak due to Ba 3 d5 of Example 1.
Figure 9:
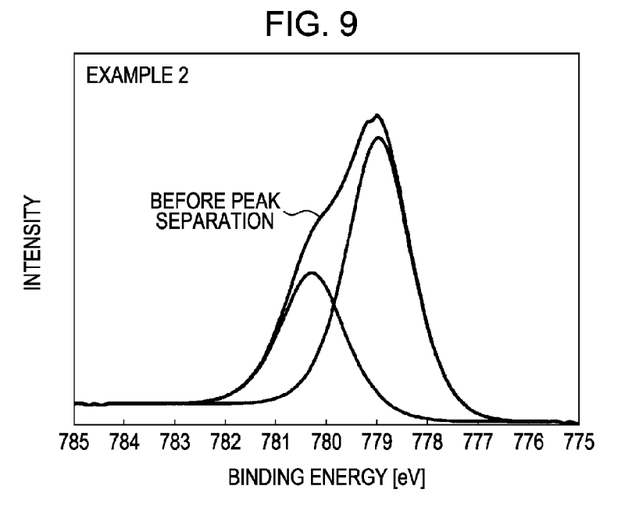
FIG. 9 is a diagram that shows a peak due to Ba 3 d5 of Example 2.
Figure 10:
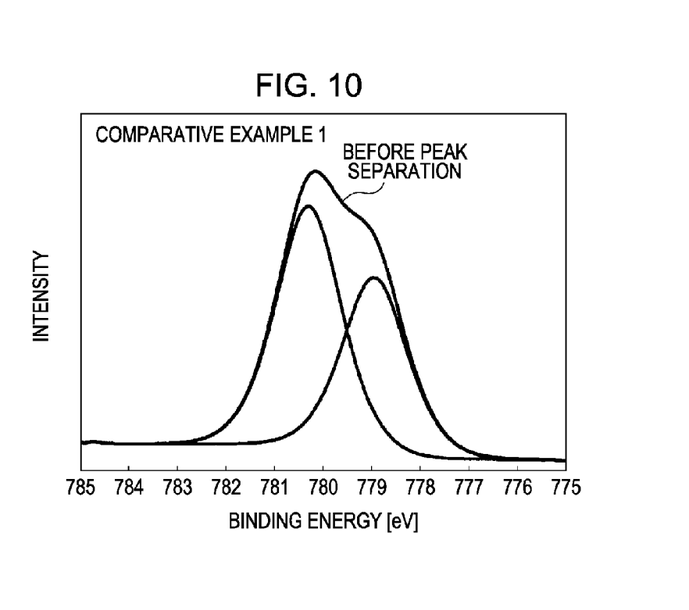
FIG. 10 is a diagram that shows a peak due to Ba 3 d5 of Comparative Example 1.

The surface analysis of the piezoelectric layer of Examples 1 to 4 and Comparative Example 1 was performed using the X-ray photoelectron spectroscopic instrument (XPS; made from Thermo Fisher Scientific company, ESCALAB 250), and the peak due to Ba 3d5 orbit was found. The operation condition in XPS was a monochrome Al-K$\alpha$ (1486.6 eV), 150 W (15 kV, 10 mA), and an analysis diameter of 500 µm$\phi$, a sample is installed to a sample holder such that the sample is not charged up in the pass energy 20 eV, and the measurement was performed without attaching a neutralization electron gun. Furthermore, as standard, the peak due to C 1s orbit was binding energy 284.8 eV. In addition, the piezoelectric layer of Examples 1 to 4 and Comparative Example 1 were before forming the second electrode 80 and after manufacturing 40 days. In regard to Examples 1 and 2 and Comparative Example 1, the peak obtained in the range of binding energy of 775 eV or more and 785 eV or less and the peak separated using the Gauss function are shown in FIG. 8 to 10. Furthermore, the peak obtained in the range of binding energy of 775 eV or more and 785 eV or less of the piezoelectric layer of Examples 3 and 4 is shown in FIG. 11.

As shown in FIGS. 8 and 9, the piezoelectric layer of Examples 1 and 2 has a peak in 779.0±0.8 eV when separating the peak obtained in the range of binding energy of 775 eV or more and 785 eV or less using the Gauss function, and has a peak having intensity that is lower than the above-mentioned peak at a high binding energy side.

On the contrary, as shown in FIG. 10, the piezoelectric layer of Comparative Example 1 has a peak in 779.0±0.8 eV when separating the peak obtained in the range of binding energy of 775 eV or more and 785 eV or less using the Gauss function, but has a peak having intensity that is higher than the above-mentioned peak at a high binding energy side of the peak.

Figure 11:
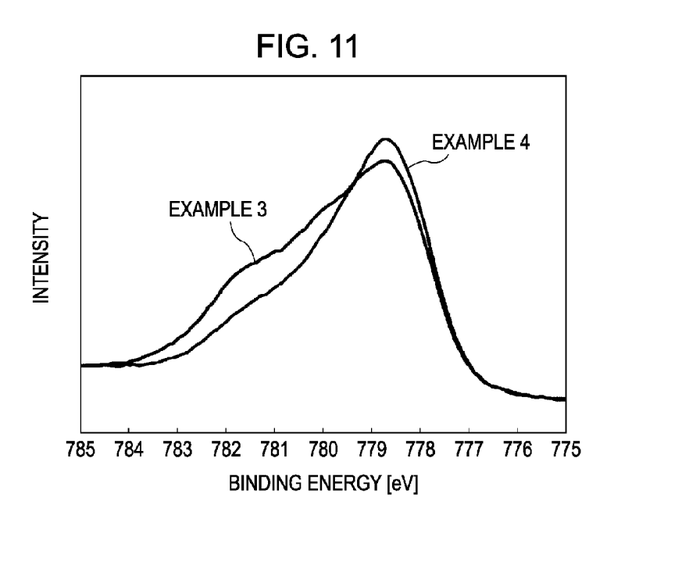
FIG. 11 is a diagram that shows a peak due to Ba 3 d5 of Examples 3 and 4.

Furthermore, as shown in FIG. 11, in Examples 3 and 4, the peak position was hardly changed, and although not shown in FIG. 11, the positions of each peak and intensities of each peak were nearly changed when separating the peak. From this fact, it was confirmed that there were few changes of the peak which is obtained in the range of binding energy of 775 eV or more and 785 eV or less by the change of the composition ratio of manganese.

Test Example 2

In regard to the respective piezoelectric element of Examples 1 and 2 and Comparative Example 1, a relationship between the applied voltage and the electric current density was measured using "4140 B" made by Hewlett Packard Company at room temperature. The result thereof is shown in FIG. 12.

Figure 12:
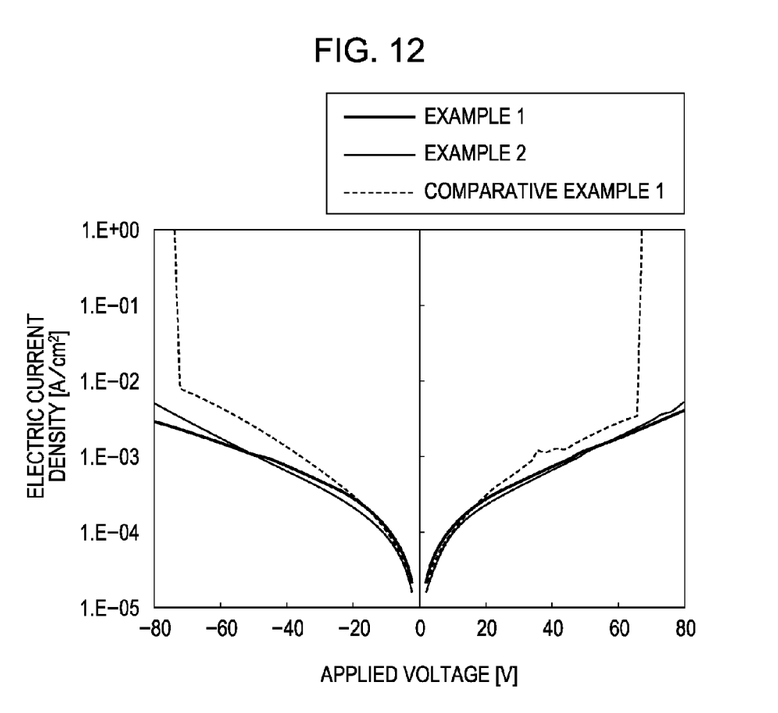
FIG. 12 is a diagram that shows a relationship between an applied voltage and an electric current density of each Example and Comparative Example 1.

As shown in FIG. 12, in Comparative Example 1, the dielectric destruction occurred in the applied voltage 60 eV or more, and on the other hand, in Example 1 and Example 2, the dielectric destruction did not occur in the applied voltage 80 eV. It was confirmed from this situation that the pressure endurance is excellent and the leak electric current is suppressed in Example 1 and Example 2.

Other Embodiments

Although an embodiment of the invention has been described above, the basic configuration of the invention is not limited to the description mentioned above. For example, in the embodiment mentioned above, although the silicon single crystalline substrate has been described as the flow path forming substrate 10, for example, a material such as a SOI substrate and a glass may be used without being limited thereto.

In addition, in the embodiment mentioned above, although the piezoelectric element 300 was described as an example in which the first electrode 60, the piezoelectric layer 70 and the second electrode 80 are laminated on the substrate (the flow path forming substrate 10), the invention is not particularly limited thereto, and for example, the invention can also be applied to a longitudinal vibration type piezoelectric element in which the piezoelectric material and the electrode forming material are alternately laminated on each other and are axially expanded and contracted.

Figure 13:
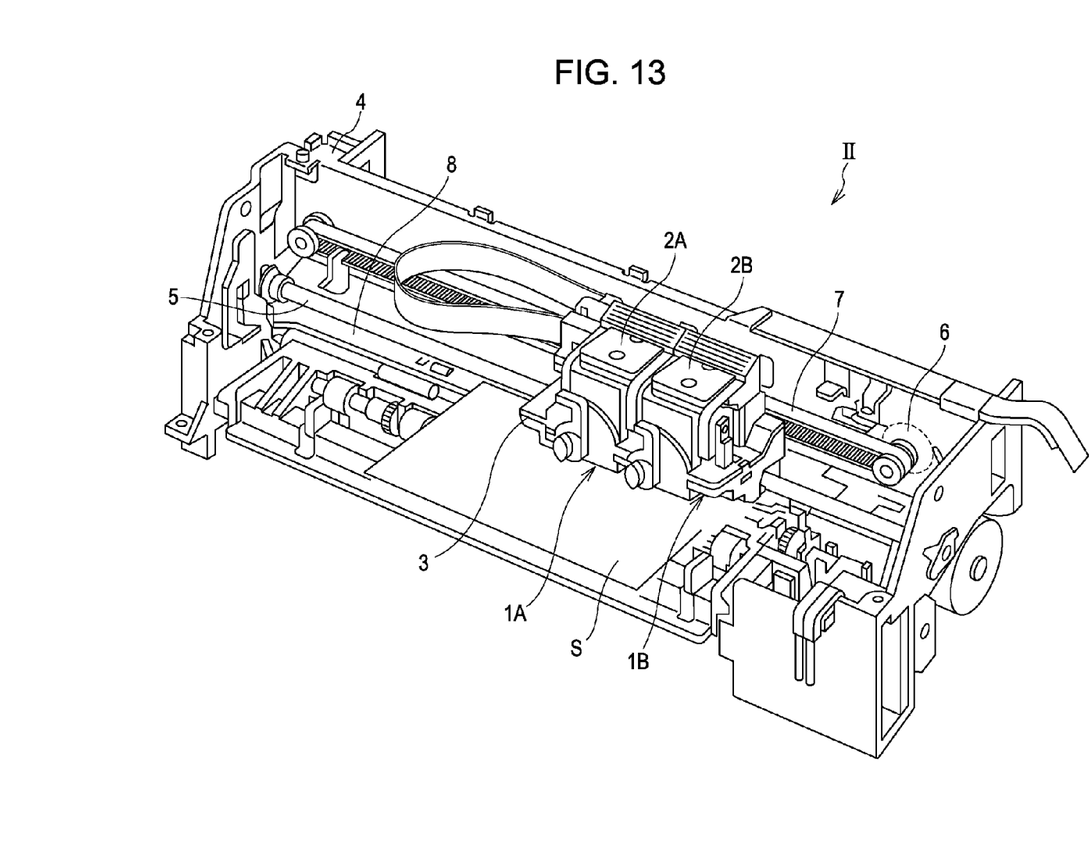
FIG. 13 is a diagram that shows a schematic configuration of a recording device according to an embodiment of the invention.

Furthermore, the ink jet type recording head of the embodiments constitutes a part of the recording head unit including the ink flow path communicating with the ink cartridge or the like, and is mounted on the ink jet type recording device. FIG. 13 is a schematic view that shows an example of the ink jet type recording device.

In an ink jet type recording device II shown in FIG. 13, recording head units 1A and 1B having an ink jet type recording head I are provided with cartridges 2A and 2B constituting ink supplying means in an attachable and detachable manner, and a carriage 3 equipped with the recording head units 1A and 1B is provided on a carriage shaft 5 attached to a device main 4 freely movable in the axial direction. The recording head units 1A and 1B, for example, each discharge a black ink composition and a color ink composition.

Moreover, the drive force of the drive motor 6 is transmitted to the carriage 3 via a plurality of gear wheels (not shown) and a timing belt 7, whereby the carriage 3 equipped with the recording head units 1A and 1B are moved along the carriage shaft 5. Meanwhile, the device main 4 is provided with a platen 8 along the carriage shaft 5, and a recording sheet S serving as a recording medium such as a paper fed by a paper feeding roller (not shown) or the like is wrapped around the platen 8 and is transported.

In addition, in the embodiments mentioned above, although the ink jet type recording head was described as an example of the liquid ejecting head, the invention is widely intended for liquid ejecting heads generally, and can of course be applied to a liquid ejecting head that ejects a liquid other than ink. As other liquid ejecting heads, for example, there are various recording heads used for an image recording device such as a printer, a color material ejecting head used for manufacturing a color filter such as a liquid crystal display, an organic EL display, an electrode material ejecting head used for forming an FED (field emission display) electrode or the like, a living organic matter ejecting head used for manufacturing a bio-chip or the like.

Furthermore, the piezoelectric element according to the invention is not limited to the piezoelectric element used in the liquid ejecting head but can also be used in other devices. As other devices, there are an ultrasonic device such as an ultrasonic transmitter, an ultrasonic motor, a temperature-electricity converter, a pressure-electricity converter, a ferroelectric transistor, a piezoelectric transformer, an interception filter of harmful rays such as infrared rays, an optical filter using a photonic crystal effect using a quantum dot formation, a filter such as an optical filter using an optical interference of a thin film or the like. Furthermore, it is also possible to apply the invention to the piezoelectric element used as the sensor and the piezoelectric element used as a ferroelectric memory. As the sensor using the piezoelectric element, for example, there is an infrared sensor, an ultrasonic sensor, a heat-sensitive sensor, a pressure sensor, a pyroelectric sensor, a gyro sensor (an angular velocity sensor) or the like.

What is claimed is:

1. A liquid ejecting head comprising:
    a piezoelectric element having a piezoelectric layer and an electrode provided in the piezoelectric layer,
    wherein the piezoelectric layer is formed of a complex oxide having a perovskite structure containing bismuth, barium, iron and titanium, binding energy of C—C and C—H states of a peak due to C 1s in an X-ray photoelectron spectroscopy measurement is standardized as 284.8 eV, when a peak obtained in a range of a binding energy of 775 eV or more and 785 eV or less is separated using a Gauss function, the binding energy has the peak in 779.0±0.8 eV, and one or more peak having intensity lower than that of the peak is included at the high binding energy side.

2. The liquid ejecting head according to claim 1,
    wherein the complex oxide further includes at least one material that is selected from a group including manganese, cobalt, chrome, nickel and copper.

3. A liquid ejecting apparatus comprising the liquid ejecting head according to claim 1.

4. A liquid ejecting apparatus comprising the liquid ejecting head according to claim 2.

5. A piezoelectric element comprising:
    a piezoelectric layer; and
    an electrode provided in the piezoelectric layer,
    wherein the piezoelectric layer is formed of a complex oxide having a perovskite structure containing bismuth, barium, iron and titanium, binding energy of C—C and C—H states of a peak due to C 1s in an X-ray photoelectron spectroscopy measurement is standardized as 284.8 eV, when a peak obtained in a range of a binding energy of 775 eV or more and 785 eV or less is separated using a Gauss function, the binding energy has the peak in 779.0±0.8 eV, and one or more peak having intensity lower than that of the peak is included at the high binding energy side.

* * * * *